(12) United States Patent
Kim et al.

(10) Patent No.: US 12,520,587 B2
(45) Date of Patent: Jan. 6, 2026

(54) THIN FILM TRANSISTOR AND DISPLAY APPARATUS

(71) Applicant: LG Display Co., Ltd., Seoul (KR)

(72) Inventors: Hyun Jin Kim, Paju-si (KR); Kum Mi Oh, Paju-si (KR); Seung Hyo Ko, Paju-si (KR); Sun Wook Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 696 days.

(21) Appl. No.: 17/774,465

(22) PCT Filed: Mar. 31, 2020

(86) PCT No.: PCT/KR2020/004402
§ 371 (c)(1),
(2) Date: May 4, 2022

(87) PCT Pub. No.: WO2021/091032
PCT Pub. Date: May 14, 2021

(65) Prior Publication Data
US 2022/0392984 A1    Dec. 8, 2022

(30) Foreign Application Priority Data

Nov. 7, 2019  (KR) .......................... 10-2019-0141593

(51) Int. Cl.
*H10D 86/40* (2025.01)
*H10D 30/67* (2025.01)
(Continued)

(52) U.S. Cl.
CPC ....... *H10D 86/481* (2025.01); *H10D 30/6734* (2025.01); *H10D 86/60* (2025.01); *H10H 29/32* (2025.01); *H10H 29/8321* (2025.01)

(58) Field of Classification Search
CPC .... H10H 29/49; H10H 29/8321; H10H 29/32; H10H 29/012; H10D 30/0312;
(Continued)

(56) References Cited

U.S. PATENT DOCUMENTS 7,700,418 B2 * 4/2010 Kunii ................. H10D 30/6734
257/E21.112
8,648,397 B2 * 2/2014 Kaneko ............. H10D 30/6733
257/E33.072
(Continued)

FOREIGN PATENT DOCUMENTS

DE    102015116395 A1 *  3/2016  ....... G02F 1/136213
KR    10-2016-0084567 A    7/2016
(Continued)

*Primary Examiner* — Earl N Taylor
(74) *Attorney, Agent, or Firm* — Seed Intellectual Property Law Group LLP

(57) ABSTRACT

Embodiments of the present disclosure are related to a thin film transistor and a display device, as disposing a capacitor electrode on a gate electrode of the thin film transistor including double gate electrodes, an area where a storage capacitor occupies in a subpixel is reduced and a space availability can be improved. Furthermore, among the double gate electrodes, a gate electrode forming a storage capacitor doesn't overlap a part of a channel, and a part of the capacitor electrode overlaps a part of the channel, so it can be possible to control electric field by the capacitor electrode, thus the thin film transistor having a high output current and a current stability can be provided.

19 Claims, 7 Drawing Sheets

(51) Int. Cl.
*H10D 86/60* (2025.01)
*H10H 29/32* (2025.01)
*H10H 29/80* (2025.01)

(58) Field of Classification Search
CPC ........... H10D 30/6734; H10D 30/6757; H10D 86/60; H10D 86/481; H10D 86/0212; H10K 59/1213; H10K 59/1216; H10K 59/131; H01L 29/78648; H01L 29/78696; H01L 27/1255; H01L 27/1262; H01L 27/3262; H01L 27/3265; H01L 27/3276

See application file for complete search history.

(56) References Cited

U.S. PATENT DOCUMENTS

| | | | |
|---|---|---|---|
| 10,347,704 B2 * | 7/2019 | Kim | H10D 86/60 |
| 2003/0025848 A1 * | 2/2003 | Sera | G02F 1/136209 |
| | | | 349/43 |
| 2005/0051800 A1 * | 3/2005 | Mishra | H10D 84/01 |
| | | | 257/E29.127 |
| 2012/0256184 A1 * | 10/2012 | Kaneko | H10D 30/6715 |
| | | | 257/E29.273 |
| 2016/0155858 A1 * | 6/2016 | Yoo | H10D 84/401 |
| | | | 257/66 |
| 2017/0317159 A1 * | 11/2017 | Kim | H10D 86/421 |
| 2018/0108720 A1 * | 4/2018 | Kim | H10D 30/6755 |
| 2019/0123119 A1 * | 4/2019 | Miyamoto | H10D 30/6739 |
| 2019/0198677 A1 * | 6/2019 | Wu | H10D 99/00 |
| 2020/0161407 A1 * | 5/2020 | Ka | G09G 3/3225 |
| 2024/0304726 A1 * | 9/2024 | Kim | G09G 3/3233 |

FOREIGN PATENT DOCUMENTS

| | | | |
|---|---|---|---|
| KR | 10-2017-0081110 A | | 7/2017 |
| KR | 10-2017-0124672 A | | 11/2017 |
| KR | 20170124672 A | * | 11/2017 |
| KR | 10-2019-0028587 A | | 3/2019 |

* cited by examiner

THIN FILM TRANSISTOR AND DISPLAY APPARATUS

CROSS REFERENCE TO RELATED APPLICATION

This application claims priority under section 119(a) of the US Patent Act (35 U.S.C § 119(a)) from Korean Patent Application No. 10-2019-0141593, filed on Nov. 7, 2019, which is hereby incorporated by reference for all purposes as if fully set forth herein. In addition, if this application claims priority to countries other than the United States for the same reason as above, all contents thereof are incorporated into this patent application by reference.

FIELD

Embodiments of the present disclosure are related to a thin film transistor and a display device.

DESCRIPTION OF RELATED ART

The growth of the information society leads to increased demand for display devices to display images and use of various types of display devices, such as liquid crystal display devices, organic light emitting display devices, etc.

The display devices, for example, can include a display panel in which a plurality of subpixels are disposed, and various driving circuit for driving the display panel. And each subpixel, according to types of the display devices, can include a light-emitting element, and a circuit element for driving the light-emitting element.

Here, as an area of the circuit element disposed in the subpixel increases, an area of a light-emitting area may be reduced, thus there is a problem that a luminous efficiency can be decreased. Furthermore, in a case of increasing a driving characteristic of the circuit element for increasing the luminous efficiency, there is a problem that a driving stability of the circuit element can be decreased.

Thus, methods are required to increasing the luminous efficiency of the subpixel while improving the driving characteristic and the driving stability of the circuit element disposed in the subpixel.

SUMMARY

Technical Problem to be Solved

Embodiments of the present disclosure provide methods for improving a current stability while increasing a current characteristic of a driving transistor disposed in a subpixel.

Embodiments of the present disclosure provide methods for implementing a display device of a high resolution by reducing an area where a circuit element occupies in the subpixel while improving the current characteristic and the current stability of the driving transistor.

Solution to Solve the Problem

In an aspect, embodiments of the present disclosure can provide a display device including, a first gate electrode positioned on a substrate, an active layer positioned on the first gate electrode and including channel region overlapping at least a part of the first gate electrode, a second gate electrode positioned on the active layer and overlapping a first area of the channel region, and a capacitor electrode including a first portion positioned on the second gate electrode and overlapping at least a part of the second gate electrode and a second portion connected to the first portion and overlapping at least a part of a second area except the first area of the channel region.

Here, the second gate electrode can be positioned in area except an area overlapped with the second area of the channel region.

The first portion of the capacitor electrode can be positioned higher than the second portion of the capacitor electrode. And a point that the first portion of the capacitor electrode and the second portion of the capacitor electrode are connected to each other can be positioned in an area except an area overlapped with the second gate electrode.

An identical voltage can be supplied to the first gate electrode and the second gate electrode, and a constant voltage different from a voltage supplied to the second gate electrode can be supplied to the capacitor electrode.

In another aspect, embodiments of the present disclosure can provide a display device including, a display panel in which a plurality of gate lines, a plurality of data lines and a plurality of subpixels are disposed, a plurality of light-emitting elements disposed in each of the plurality of subpixels, and a plurality of driving transistors disposed in each of the plurality of subpixels and electrically connected to the light-emitting element, wherein the driving transistor includes, an active layer, a first gate electrode positioned on one surface of the active layer and overlapping a channel region of the active layer, a second gate electrode positioned on other surface of the active layer and overlapping a part of the channel region of the active layer, and a third gate electrode positioned on the other surface of the active layer, positioned farther from the active layer than the second gate electrode, and overlapping the channel region of the active layer.

In another aspect, embodiments of the present disclosure can provide a thin film transistor including, a first gate electrode, an active layer positioned on the first gate electrode and including a channel region overlapping at least a part of the first gate electrode, a second gate electrode positioned on the active layer and overlapping a first area of the channel region, and a third gate electrode at least partially positioned on the second gate electrode, overlapping at least a part of the second gate electrode, and overlapping at least a part of a second area except the first area of the channel region.

Advantages of the Disclosure

According to various embodiments of the present disclosure, as a top gate electrode of a driving transistor including double gate electrodes overlaps a part of a channel and a capacitor electrode positioned on the top gate electrode overlaps a part of the channel, thus a current stability of the driving transistor can be improved by an electric field control by the capacitor electrode.

Furthermore, as performing the electric field control by using the capacitor electrode positioned on the top gate electrode of the driving transistor, thus a current characteristic and the current stability of the driving transistor can be improved while minimizing an area where a circuit element occupies in a subpixel.

BRIEF DESCRIPTION OF THE DRAWINGS

The above and other objects, features, and advantages of the present disclosur e will be more clearly understood from the following detailed description, taken in co njunction with the accompanying drawings, in which.

DETAILED DESCRIPTION

Figure 1:
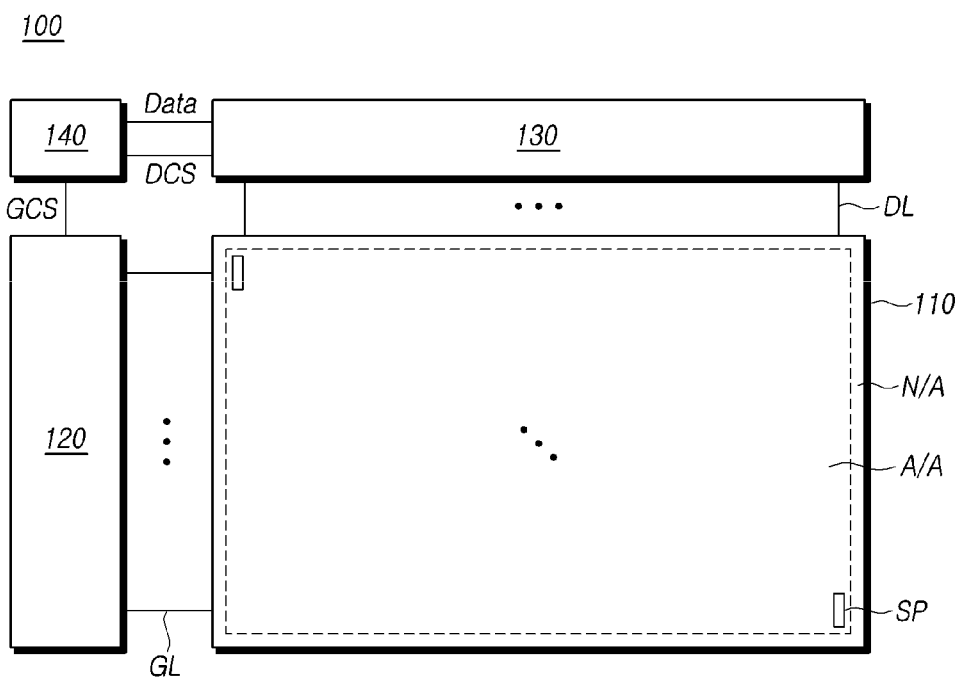
FIG. 1 is a diagram illustrating a schematic configuration of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram illustrating a schematic configuration of a display device 100 according to embodiments of the present disclosure.

Referring to FIG. 1, the display device 100 according to exemplary embodiments can include a display panel 110 including an active area A/A and a non-active area N/A positioned outside of the active area A/A, as well as components for driving the display panel 110, such as a gate driving circuit 120, a data driving circuit 130, and a controller 140.

In the display panel 110, a plurality of gate lines GL and a plurality of data lines DL can be disposed, and a plurality of subpixels SP can be disposed in areas in which the plurality of gate lines GL intersect the plurality of data lines DL. Each of the plurality of subpixels SP can include circuit elements, and two or more subpixels SP can provide a single pixel.

The gate driving circuit 120 is controlled by the controller 140 to sequentially output a scan signal to the plurality of gate lines GL, disposed in the display panel 110, thereby controlling points in time at which the plurality of subpixels SP are driven.

In addition, the gate driving circuit 120 can output an emission signal to control emission times of the subpixels SP. The circuit outputting the scan signal and the circuit outputting the emission signal can be provided integrally or separately.

The gate driving circuit 120 can include one or more gate driver integrated circuits GDICs, and can be disposed on one side or both sides of the display panel 110, depending on the driving system. Furthermore, the gate driving circuit 120 can be implemented as a GIP(Gate In Panel) type disposed in a bezel area of the display panel 110.

The data driving circuit 130 receives image data from the controller 140 and converts the image data into an analog data voltage. In addition, the data driving circuit 130 outputs the data voltage to the data lines DL, respectively, at points in time at which the scan signal is applied through the gate lines GL, so that the subpixels SP represent luminous intensities corresponding to the image data.

The data driving circuit 130 can include one or more source driver integrated circuits SDICs. In addition, the data driving circuit 130 can be disposed on one side or both sides of the display panel 110, depending on the driving system.

The controller 140 supplies a variety of control signals to the gate driving circuit 120 and the data driving circuit 130 to control the operations of the gate driving circuit 120 and the data driving circuit 130.

The controller 140 controls the gate driving circuit 120 to output the scan signal at points in time defined by frames, and the controller 140 converts image data, received from an external source, into a data signal format readable by the data driving circuit 130, and outputs the converted image data to the data driving circuit 130.

The controller 140 receives a variety of timing signals, including a vertical synchronization signal VSYNC, a horizontal synchronization signal HSYNC, an input data enable signal DE, a clock signal CLK, and the like, in addition to the image data, from an external source (e.g. a host system).

The controller 140 can generate a variety of control signals using the variety of timing signals received from the external source and output the control signals to the gate driving circuit 120 and the data driving circuit 130.

For example, the controller 140 outputs a variety of gate control signals GCS, including a gate start pulse GSP, a gate shift clock GSC, a gate output enable signal GOE, and the like, to control the gate driving circuit 120.

Here, the gate start pulse GSP controls the operation start time of the one or more gate driver integrated circuits GDICs of the gate driving circuit 120. The gate shift clock GSC is a clock signal commonly input to the one or more gate driver integrated circuits GDICs to control the shift time of the scan signal. The gate output enable signal GOE designates timing information of the one or more gate driver integrated circuits GDICs.

In addition, the controller 140 outputs a variety of data control signals DCS, including a source start pulse SSP, a source sampling clock SSC, a source output enable signal SOE, and the like, to control the data driving circuit 130.

Here, the source start pulse SSP controls the data sampling start time of the one or more source driver integrated circuits SDICs of the data driving circuit 130. The source sampling clock SSC is a clock signal controlling the sampling time of data in each of the source driver integrated circuit SDICs. The source output enable signal SOE controls the output time of the data driving circuit 130.

The display device 100 can further include a power management integrated circuit to supply various forms of voltage or current to the display panel 110, the gate driving circuit 120, the data driving circuit 130, and the like, or control various forms of voltage or current to be supplied to the same.

Each of the subpixels SP can accommodate a plurality of circuit elements for driving the subpixel SP, and a liquid crystal or a light-emitting element ED can be disposed in the subpixel SP depending on types of the display device 100.

Here, the light-emitting element ED, for example, can be an organic light-emitting diode. Alternatively, the light-emitting element ED can be an inorganic light-emitting diode LED, or can be a micro light-emitting diode μLED having a size of dozens of μm.

A circuit element disposed in the subpixel SP can be constituted variously depending on types of the subpixels, for example, a circuit element like as a plurality of thin film transistors, a capacitor, or the like, can be disposed in the subpixel SP.

Figure 2:
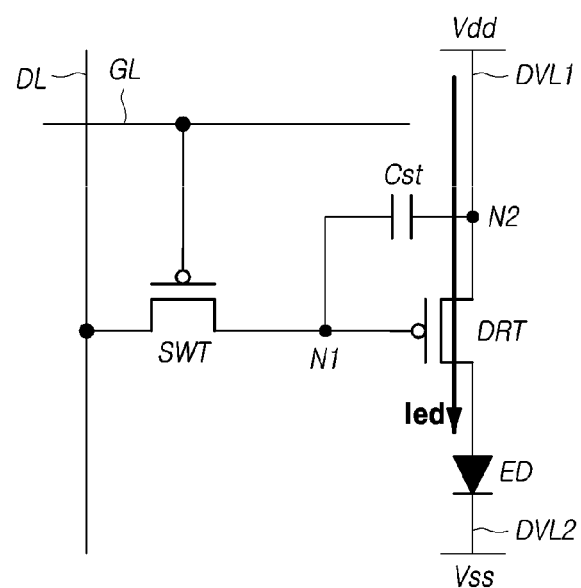
FIG. 2 is a diagram illustrating an example of a circuit structure of a subpixel disposed in a display device according to embodiments of the present disclosure.

FIG. 2 is a diagram illustrating an example of a circuit structure of the subpixel SP disposed in the display device 100 according to embodiments of the present disclosure.

Referring to FIG. 2, a light-emitting element ED can be disposed in the subpixel SP. And a switching transistor SWT, a driving transistor DRT and a storage capacitor Cst can be disposed in the subpixel SP.

That is, FIG. 2 illustrates an example of a structure of 2T1C that two thin film transistor and one capacitor are disposed, but one or more thin film transistor or one or more capacitor can be further disposed in the subpixel SP according to a driving timing of the subpixel SP or whether the subpixel SP includes a compensation circuit or not.

And FIG. 2 illustrates a structure that the thin film transistor of P type is disposed as an example, but the thin film transistor of N type can be disposed, or in some cases, the thin film transistor of P type and the thin film transistor of N type can be disposed.

The switching transistor SWT is electrically connected between the data line DL and a first node N1. The switching transistor SWT can be controlled by a scan signal applied to the gate line GL.

The driving transistor DRT is electrically connected between a first driving voltage line DVL1 supplying a first driving voltage Vdd and the light-emitting element ED. The driving transistor DRT is controlled according to a voltage level of the first node N1, and the driving transistor DRT can control a driving current Ted supplied to the light-emitting element ED.

The storage capacitor Cst is electrically connected between the first node N1 and a second node N2. The storage capacitor Cst can maintain a data voltage supplied to the first node N1 in one frame.

The light-emitting element ED can be electrically connected between the driving transistor DRT and a second driving voltage line DVL2 supplying a second driving voltage Vss.

As explaining a driving scheme briefly, the switching transistor SWT can be turned-on when the scan signal of a turned-on level is applied to the gate line GL. The data voltage is supplied to the data line DL and applied to the first node N1 in a period that the switching transistor SWT is turned-on.

The driving transistor DRT can be turned-on when the data voltage is applied to the first node N1 in a state that the first driving voltage Vdd is applied to the second node N2, and can supply the driving current Ted corresponding to the data voltage to the light-emitting element ED. And the light-emitting element ED can emit a light according to the driving current Ted supplied through the driving transistor DRT and can represent a luminance corresponding to the data voltage.

Thus, a current output characteristic of the driving transistor DRT is very important for the light-emitting element ED to represent a luminance according to the data voltage exactly. Furthermore, although increasing a performance of the driving transistor DRT, a light-emitting area by the light-emitting element ED can be maximized as minimizing an area that the circuit element occupies in the subpixel SP.

That is, for increasing a driving characteristic and a driving efficiency of the subpixel SP and implementing the display device 100 of a high resolution, it is required to improve a driving characteristic of the driving transistor DRT without increasing an area of the circuit element including the driving transistor DRT.

Embodiments of the present disclosure can provide methods to improve a current output characteristic and a current stability of the driving transistor DRT while minimizing an area where the circuit element is disposed in the subpixel SP.

Figure 3:
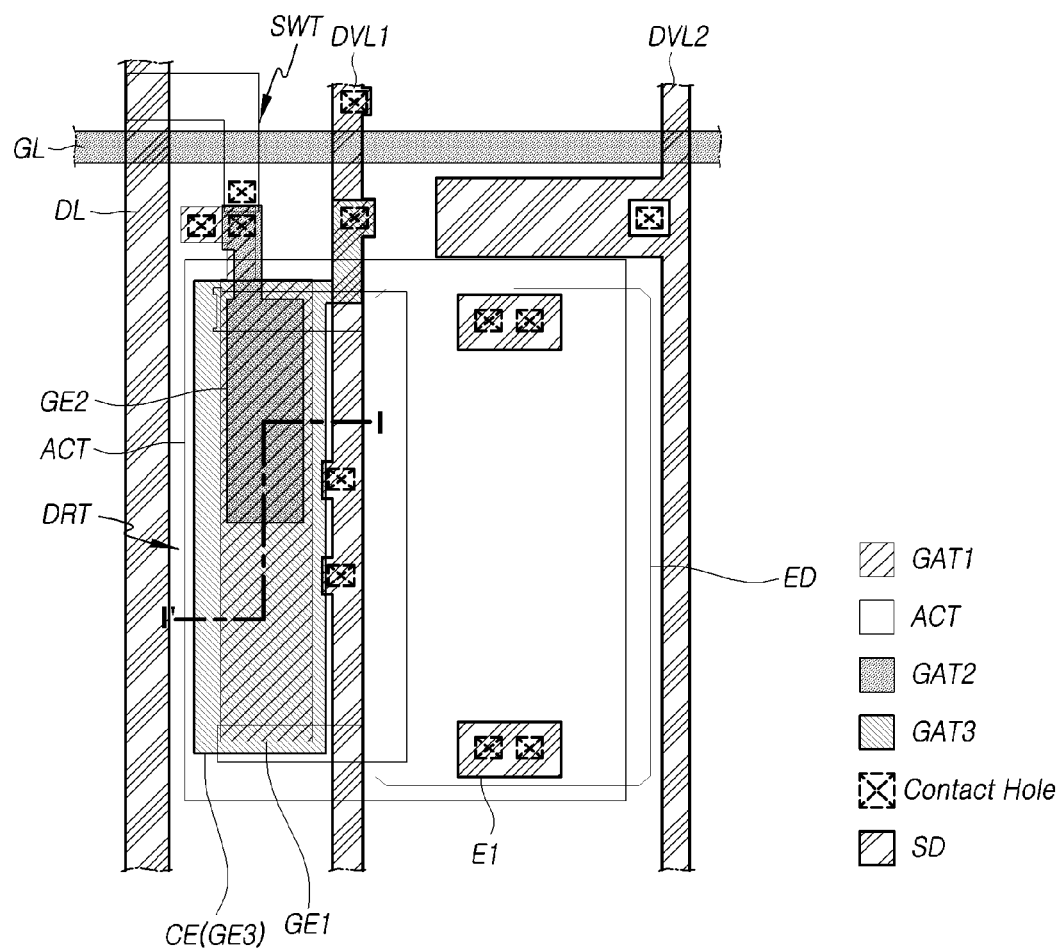
FIG. 3 is a diagram illustrating an example of a plane structure of a subpixel disposed in a display device according to embodiments of the present disclosure.

FIG. 3 illustrates an example of a plane structure of the subpixel SP disposed in the display device 100 according to embodiments of the present disclosure, and is a diagram illustrating an example of a structure of 2T1C abovementioned. And FIG. 4 illustrates an example of a cross-sectional structure of the driving transistor DRT disposed in the subpixel SP, and illustrates an example of a cross-sectional structure of I-I' part illustrated in FIG. 3.

Figure 4:
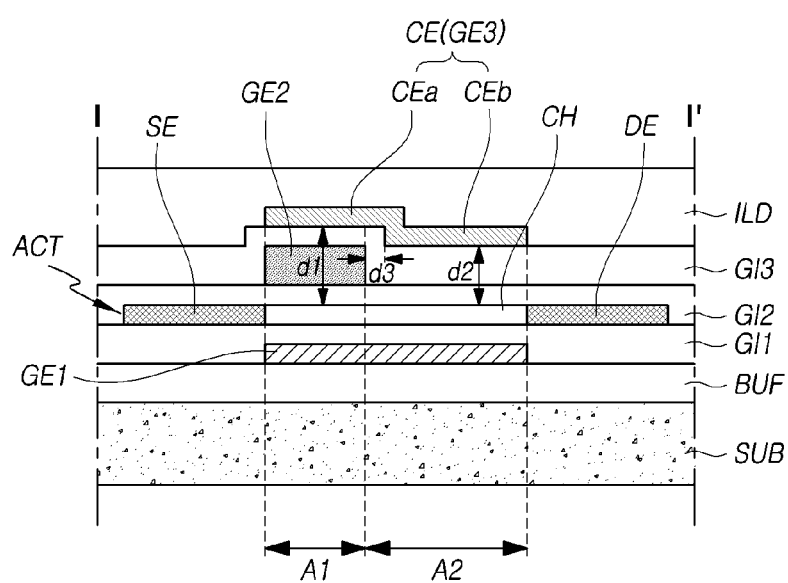
FIG. 4 is a diagram illustrating an example of a cross-sectional structure of I-I' part illustrated in FIG. 3.

Referring to FIG. 3 and FIG. 4, a buffer layer BUF can be disposed on a substrate SUB, and a first gate electrode GE1 made of a first gate metal GAT1 can be disposed on the buffer layer BUF.

As the first gate electrode GE1 is a gate electrode of the driving transistor DRT, thus can be electrically connected to the data line DL through the switching transistor SWT.

A first gate insulating layer GI1 can be disposed on the first gate electrode GE1. And an active layer ACT can be disposed on the first gate insulating layer GI1.

The active layer ACT can include a channel region CH which is a semiconductor region, and a source region SE and a drain region DE being an area P+ or N+ doped.

An example illustrated in FIG. 4 illustrates a case that the source region SE and the drain region DE are P+ doped. And the source region SE can be electrically connected to the first driving voltage line DVL1 through a contact-hole, and the drain region DE can be electrically connected to a first electrode EI which is an anode electrode of the light-emitting element ED.

A second gate insulating layer GI2 can be disposed on the active layer ACT. And a second gate electrode GE2 made of a second gate metal GAT2 can be disposed on the second gate insulating layer GI2. Furthermore, the gate line GL made of the second gate metal GAT2 can be disposed on a same layer with the second gate electrode GE2.

The second gate electrode GE2 can overlap a part area of the channel region CH of the active layer ACT, and can be electrically connected to the data line DL through the switching transistor SWT.

That is, the driving transistor DRT according to embodiments of the present disclosure can be a structure including double gate electrodes. As an electric field is formed by the first gate electrode GE1 and the second gate electrode GE2, thus an output current of the driving transistor DRT can be increased.

A third gate insulating layer GI3 can be disposed on the second gate electrode GE2, and a capacitor electrode CE made of a third gate metal GAT3 can be disposed on the third gate insulating layer GI3. And an interlayer insulating layer ILD can be disposed on the capacitor electrode CE.

The data line DL, the first driving voltage line DVL1 and the second driving voltage line DVL2 made of a source/drain metal SD can be disposed on the interlayer insulating layer ILD.

Here, the capacitor electrode CE can be seen as a third gate electrode GE3.

The capacitor electrode CE can include a first portion CEa positioned on the second gate electrode GE2 and overlapped with at least a part of the second gate electrode GE2. Furthermore, the capacitor electrode CE can include a second portion CEb connected to the first portion CEa and positioned in an area except an area overlapped with the second gate electrode GE2.

The second portion CEb of the capacitor electrode CE can be overlapped with a part area of the channel region CH of the active layer ACT.

Thus, the first portion CEa of the capacitor electrode CE can be constituted the storage capacitor Cst with the second gate electrode GE2. Furthermore, as the second portion CEb of the capacitor electrode CE overlaps a part area of the channel region CH of the active layer ACT, thus can provide a function of the gate electrode controlling the current output of the driving transistor DRT. And as the capacitor electrode CE should form a capacitance with the second gate electrode GE2, thus a constant voltage (e.g., the first driving voltage Vdd) different from a voltage applied to the first gate electrode GE1 and the second gate electrode GE2 can be applied to the capacitor electrode CE. Thus, an electric field can be formed on the channel region CH adjacent to the drain region DE of the driving transistor DRT, and the output characteristic of the driving transistor can be stabilized. That is, a high current can be output by forming an electric field by the first gate electrode GE1 and the second gate electrode GE2, and also the capacitor electrode CE that the constant voltage different from a voltage applied to the first gate electrode GE1 and the second gate electrode GE2 is applied can disperse an electric field on the drain region DE and thus can stabilize the current output.

As described above, as disposing the capacitor electrode CE constituting the storage capacitor Cst in the subpixel SP on the second gate electrode GE2, an area increase due to an arrangement of the storage capacitor Cst can be prevented.

Furthermore, as disposing the second gate electrode GE2 forming the storage capacitor Cst with the capacitor electrode CE not to be overlapped with a part of the channel region CH, thus the capacitor electrode CE can be overlapped with a part of the channel region CH of the active layer ACT.

Thus, as it makes an electric field control by the capacitor electrode CE to be possible, the current stability of the driving transistor DRT can be improved through the electric field control by the capacitor electrode CE while increasing the output current of the driving transistor DRT by double gate electrodes.

Describing a structure of a gate electrode included in the driving transistor DRT specifically, for example, the first gate electrode GE1 can be disposed to be overlapped with the channel region CH of the active layer ACT.

And a length of the first gate electrode GE1 can be identical to a length of the channel region CH.

As the second gate electrode GE2 which is a top gate electrode in a structure of double gate electrodes isn't overlapped with a part of the channel region CH, the first gate electrode GE1 which is a bottom gate electrode can be disposed to be overlapped with the channel region CH entirely.

The second gate electrode GE2 can be disposed to be overlapped with a first area A1 which is a part area of the channel region CH of the active layer ACT. And the second gate electrode GE2 can be disposed not to be overlapped with a second area A2 of the channel region CH of the active layer ACT.

Thus, a length of the second gate electrode GE2 can be shorter than the length of the channel region CH of the active layer ACT. Furthermore, the length of the second gate electrode GE2 can be shorter than the length of the first gate electrode GE1.

Here, one end of the second gate electrode GE2 can be disposed to be overlapped with a boundary of the channel region CH. And other end of the second gate electrode GE2 can be disposed to be spaced apart from the boundary of the channel region CH.

That is, such as an example illustrated in FIG. 4, the second gate electrode GE2 can be disposed to be aligned with the boundary of the channel region CH and the source region SE of the active layer ACT, and can constitute double gate electrodes with the first gate electrode GE1 to increase the output current of the driving transistor DRT.

The capacitor electrode CE is positioned on the second gate electrode GE2. And the capacitor electrode CE can include a portion overlapping the second gate electrode GE2, and a portion not overlapping the second gate electrode GE2 and overlapping the channel region CH of the active layer ACT.

For example, the capacitor electrode CE can include the first portion CEa overlapping the first area A1 of the channel region CH, and the second portion CEb overlapping the second area A2 of the channel region CH.

As the first portion CEa of the capacitor electrode CE overlaps the first area A1 of the channel region CH, thus can form the storage capacitor Cst with the second gate electrode GE2.

As the second portion CEb of the capacitor electrode CE overlaps the second area A2 of the channel region CH and other electrodes are not disposed therebetween, thus the electric field control can be performed by the second portion CEb of the capacitor electrode CE.

A length of the capacitor electrode CE can be identical to the length of the channel region CH.

For example, the source region SE and the drain region DE of the active layer ACT can be formed by performing a doping process in a state that the capacitor electrode CE is disposed. Thus, a boundary of the capacitor electrode CE and a boundary of the channel region CH of the active layer ACT can overlap each other.

And as the capacitor electrode CE is disposed after that the third gate insulating layer GI3 is disposed on the second gate electrode GE2 only overlapped with the first area A1 of the channel region CH, thus the capacitor electrode CE can include a part that a height is changed.

Such as an example illustrated in FIG. 4, the first portion CEa of the capacitor electrode CE can be positioned higher than at least a part of the second portion CEb. And a distance d1 between the first portion CEa of the capacitor electrode CE and the active layer ACT can be greater than a distance d2 between the second portion CEb of the capacitor electrode CE and the active layer ACT.

Thus, the second portion CEb of the capacitor electrode CE can be positioned more close to the active layer ACT, the electric field control for stabilizing the output characteristic of the driving transistor DRT can be performed easily.

Here, the part that a height of the capacitor electrode CE is changed can be positioned in an area except an area where the capacitor electrode CE and the second gate electrode GE2 overlap each other. For example, the part that the height of the capacitor electrode CE is changed can be positioned to be spaced apart from a side surface of the second gate electrode GE2 by d3.

That is, the storage capacitor Cst can be formed by making a distance between the capacitor electrode CE and the second gate electrode GE2 evenly. And as a part overlapping the second area A2 of the channel region CH while the height of the capacitor electrode CE is changed is positioned close to the channel region CH, thus the output characteristic of the driving transistor DRT can be stabilized by the electric field control.

Furthermore, as the first gate electrode GE1 which is the bottom gate electrode can be disposed in an area including an area overlapping the channel region CH, thus, in some cases, the length of the first gate electrode GE1 can be equal or greater than the length of the channel region CH.

Figure 5:
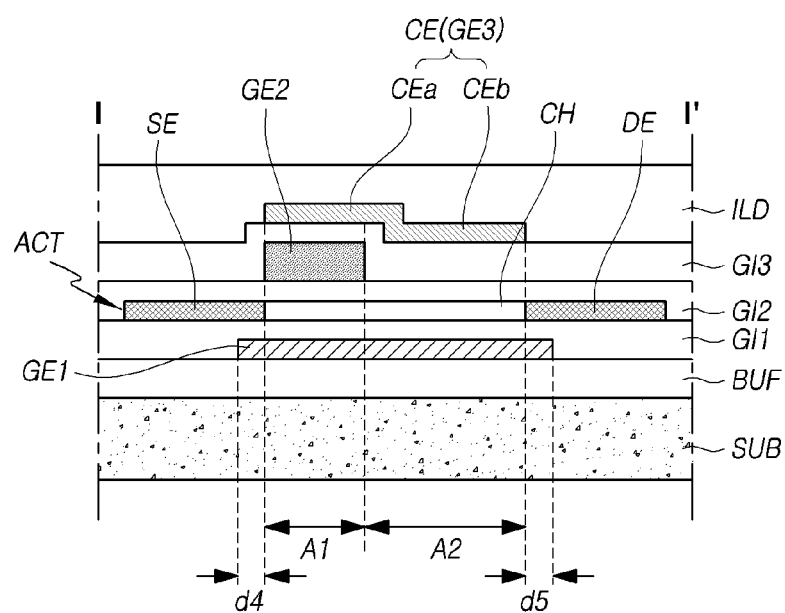
FIG. 5 is a diagram illustrating another example of a cross-sectional structure of I-I' part illustrated in FIG. 3.

FIG. 5 illustrates another example of a cross-sectional structure of the driving transistor DRT, and is a diagram illustrating another example of a cross-sectional structure of I-I' part illustrated in FIG. 3.

Referring to FIG. 5, the first gate electrode GE1 can be positioned under the active layer ACT. And the second gate electrode GE2 and the capacitor electrode CE can be positioned on the active layer ACT.

The second gate electrode GE2 can be disposed to be overlapped with the first area A1 of the channel region CH of the active layer ACT. A part of the capacitor electrode CE can be positioned in an area overlapped with the first area A1 of the channel region CH to be overlapped with the second gate electrode GE2, and another part of the capacitor electrode CE can be positioned in an area overlapped with the second area A2 of the channel region CH.

A part of a boundary of the second gate electrode GE2 and the capacitor electrode CE can be overlapped with a boundary between the channel region CH and the source region SE of the active layer ACT.

The second gate electrode GE2 can be overlapped with the first area A1 of the channel region CH to constitute double gate electrodes with the first gate electrode GE1. Thus, the output current of the driving transistor DRT can be increased.

And as the second gate electrode GE2 is disposed not to be overlapped with the second area A2 of the channel region CH and a part of the capacitor electrode CE is disposed to be overlapped with the second area A2 of the channel region CH, thus the current stability of the driving transistor DRT can be improved.

Thus, since an area where the second gate electrode GE2 isn't overlapped with the channel region CH exists, the first gate electrode GE1 constituting double gate electrodes with the second gate electrode GE2 can be disposed to overlap the channel region CH entirely. And considering a process margin, the first gate electrode GE1 can be disposed so that a boundary of the first gate electrode GE1 is positioned outside of a boundary of the channel region CH.

For example, a part of a boundary of the first gate electrode GE1 can be positioned outside of the channel region CH to be spaced apart from a boundary of the channel region CH and the source region SE by d4. Furthermore, a part of the boundary of the first gate electrode GE1 can be positioned outside of the channel region CH to be spaced apart from a boundary of the channel region CH and the drain region DE by d5.

That is, a length of the first gate electrode GE1 along a channel direction can be greater than a length of the capacitor electrode CE positioned on the second gate electrode GE2 along the channel direction.

And as a doping process is performed in a state that the capacitor electrode CE is disposed to be shorter than the first gate electrode GE1, a part of the first gate electrode GE1 can overlap the source region SE or the drain region DE.

Thus, it can be prevented that an offset area occurs in a boundary of the channel region CH of the active layer ACT, and the driving transistor DRT which the output current and stability are enhanced can be provided.

Examples described above represent a case that the storage capacitor Cst is formed on the active layer ACT, but in some cases, embodiments of the present disclosure can be applied to a case that the storage capacitor Cst is disposed under the active layer ACT.

For example, the capacitor electrode CE is disposed, and the bottom gate electrode can be disposed on the capacitor electrode CE to be overlapped with a part of the channel region CH. And as the top gate electrode is disposed to overlap the channel region CH entirely, thus the driving transistor DRT improved a driving performance and stability can be provided while minimizing an area of an element.

Furthermore, examples described above represent a case that the driving transistor DRT is P type, but embodiments of the present disclosure can be applied to a case of N type.

Figure 6:
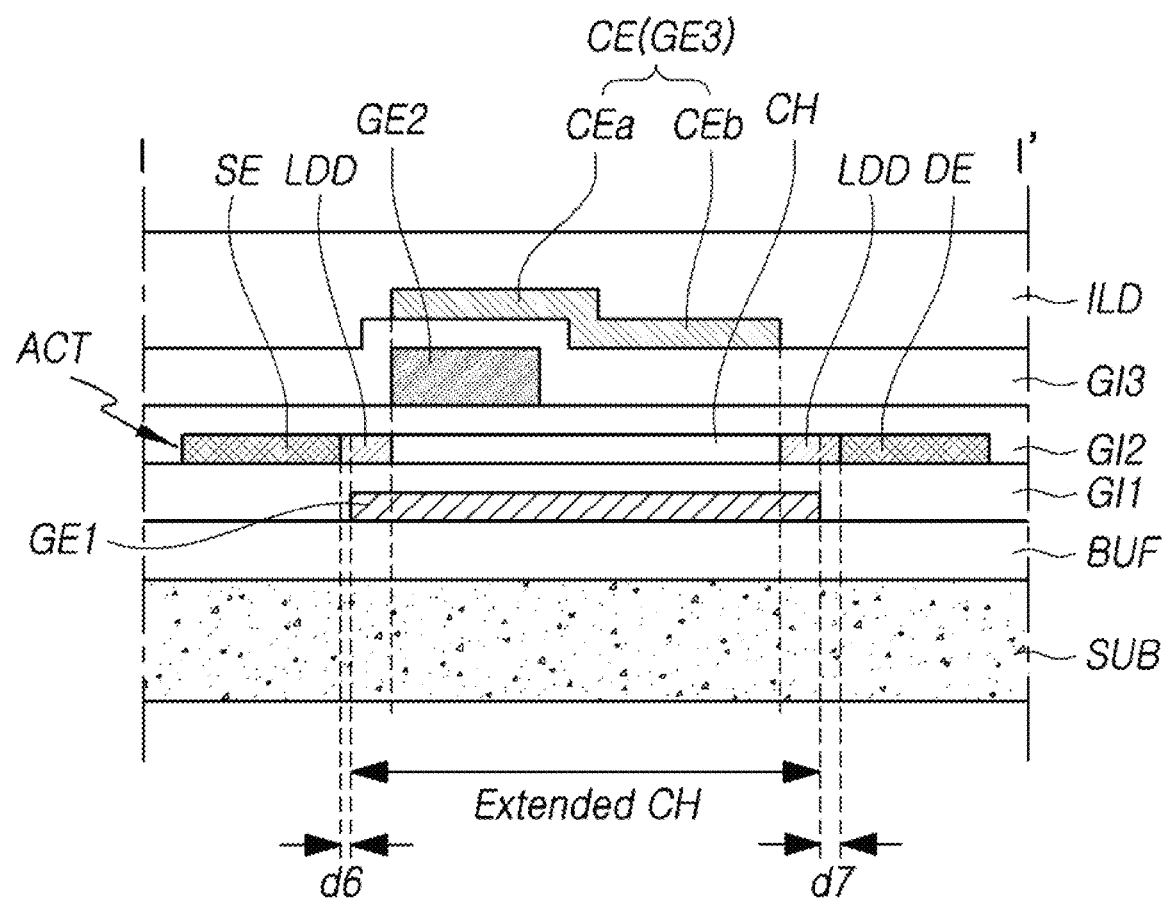
FIG. 6 is a diagram illustrating still another example of a cross-sectional structure of I-I' part illustrated in FIG. 3.

FIG. 6 illustrates still another example of a cross-sectional structure of the driving transistor DRT, and is a diagram illustrating still another example of a cross-sectional structure of I-I' part illustrated in FIG. 3.

Referring to FIG. 6, the active layer ACT can be disposed on the first gate electrode GE1. And the second gate electrode GE2 and the capacitor electrode CE can be disposed on the active layer ACT.

The active layer ACT can include a lightly doped region LDD in at least one area of areas being contact with the source region SE and the drain region DE. The lightly doped region LDD is an area where a doping is performed as lower level than the source region SE or the drain region DE, and it can be formed for reducing a leakage current.

As the lightly doped region LDD is an area where the doping is performed, thus an inner boundary of the lightly doped region LDD can be overlap a boundary of the capacitor electrode CE.

And as the first gate electrode GE1 is disposed to be longer than the capacitor electrode CE, thus a part of the first gate electrode GE1 can overlap the lightly doped region LDD.

For example, the first gate electrode GE1 can overlap the lightly doped region LDD, and can be positioned to be spaced apart from a boundary of the source region SE and the lightly doped region LDD toward inside by d6. Furthermore, the first gate electrode GE1 can overlap the lightly doped region LDD, and can be positioned to be spaced apart from a boundary of the drain region DE and the lightly doped region LDD toward inside by d7.

That is, the boundary of the first gate electrode GE1 can be positioned between an inner boundary of the lightly doped region LDD and an outer boundary of the lightly doped region LDD. Alternatively, in some cases, the boundary of the first gate electrode GE1 can overlap the inner boundary or the outer boundary of the lightly doped region LDD.

In a case that the first gate electrode GE1 overlaps the lightly doped region LDD, even the lightly doped region LDD overlapping the first gate electrode GE1 can be seen as the channel region CH.

Thus, it can be seen that the length of the first gate electrode GE1 and the length of the channel region CH are identical. And it can be seen that the length of the second gate electrode GE2 and the length of the capacitor electrode CE are smaller than the length of the channel region CH of the active layer ACT.

Even in a structure that the active layer ACT includes the lightly doped region LDD, the second gate electrode GE2 can overlap a part of the channel region CH of the active layer ACT. Thus, the second gate electrode GE2 and the first gate electrode GE1 can form double gate electrodes, and the output current of the driving transistor DRT can be increased.

And a part of the capacitor electrode CE positioned on the second gate electrode GE2 can overlap the second gate electrode GE2 to form the storage capacitor Cst. Thus, it can be prevented to increase an area of the circuit element due to an arrangement of the storage capacitor Cst in the subpixel SP.

Furthermore, a part of the capacitor electrode CE can be disposed in an area where the second gate electrode GE2 is not disposed, and can overlap a part of the channel region CH. Thus, the current stability of the driving transistor DRT can be improved by the electric field control by the capacitor electrode CE which a constant voltage different from a voltage applied to the first gate electrode GE1 or the second gate electrode GE2 is applied.

Figure 7:
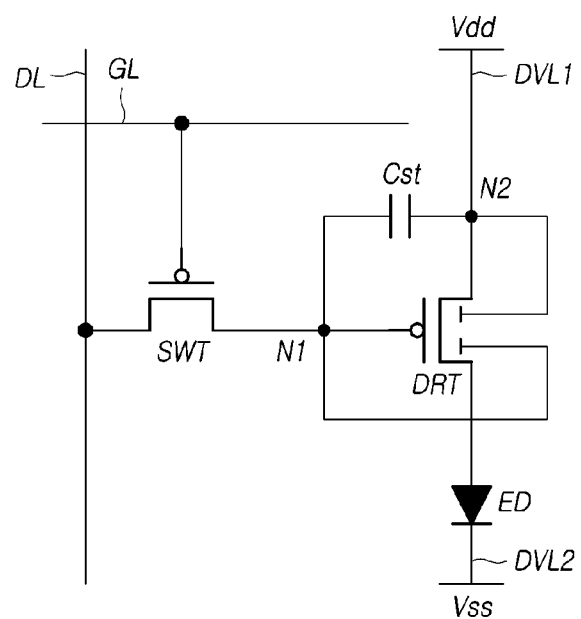
FIG. 7 is a diagram illustrating an example of a circuit structure of a subpixel illustrated in FIG. 3.

FIG. 7 is a diagram illustrating an example of a circuit structure of the subpixel SP illustrated in FIG. 3.

Referring to FIG. 7, the switching transistor SWT which a high output current is not required can be disposed as a structure of a single gate electrode. And the driving transistor DRT which a high output current is required for supplying a driving current Ied to the light-emitting element ED can be disposed as a structure of double gate electrodes.

Thus, the driving transistor DRT can include two gate electrodes electrically connected to the first node N1 which the data voltage is applied.

Here, an area where one gate electrode forming the storage capacitor Cst among two gate electrodes overlaps the channel region CH can be smaller than an area where the other gate electrode overlaps the channel region CH. And the capacitor electrode CE forming the storage capacitor Cst with the gate electrode can overlap a part of the channel region CH.

Thus, it can be seen that the driving transistor DRT includes a gate electrode electrically connected to the second node N2 which the first driving voltage Vdd is supplied. That is, it can be seen that a part of the capacitor electrode CE forms the gate electrode of the driving transistor DRT.

Such as described above, as improving the current stability by the electric field control by the capacitor electrode CE while increasing the output current of the driving transistor DRT by a structure of double gate electrodes, thus the driving transistor DRT which the driving characteristic and stability are improved can be provided.

Furthermore, as the capacitor electrode CE is disposed on the gate electrode of the driving transistor DRT, and the performance of the driving transistor DRT is improved by a structure of the capacitor electrode CE and the gate electrode, thus an area where the circuit element occupies in the subpixel SP can be reduced.

Thus, according to embodiments of the present disclosure, as the driving transistor DRT which the driving performance and stability are improved can be disposed in the subpixel SP while minimizing an area, thus the display device 100 of a high resolution can be implemented while increasing a luminous efficiency.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device, comprising:
a first gate electrode positioned on a substrate;
an active layer positioned on the first gate electrode, the active layer including a channel region overlapping at least a part of the first gate electrode;
a second gate electrode positioned on the active layer, the second gate electrode overlapping a first area of the channel region; and
a capacitor electrode including a first portion positioned on the second gate electrode and overlapping at least a part of the second gate electrode, and a second portion connected to the first portion and overlapping at least a part of a second area except the first area of the channel region, wherein at least a part of a boundary of the capacitor electrode overlaps with a boundary of the channel region.

2. The display device of claim 1, wherein a length of the capacitor electrode is, at largest, identical to a length of the channel region.

3. The display device of claim 1, wherein the first portion of the capacitor electrode is positioned higher than at least a part of the second portion of the capacitor electrode.

4. The display device of claim 1, wherein a point that the first portion of the capacitor electrode and the second portion of the capacitor electrode are connected to each other is positioned in an area except an area overlapped with the second gate electrode.

5. The display device of claim 1, wherein the capacitor electrode is electrically connected to a source region included in the active layer.

6. The display device of claim 1, wherein a length of the second gate electrode is shorter than a length of the channel region.

7. The display device of claim 1, wherein one end of the second gate electrode is overlapped with a boundary of one side of the channel region, and another end of the second gate electrode is spaced apart from a boundary of another side of the channel region.

8. The display device of claim 1, wherein the second gate electrode is positioned in an area except an area overlapped with the second area of the channel region.

9. The display device of claim 1, wherein a length of the first gate electrode is at least identical to a length of the channel region.

10. The display device of claim 1, wherein at least a part of a boundary of the first gate electrode is positioned outside of the boundary of the channel region.

11. The display device of claim 1, wherein a constant voltage different from a voltage supplied to the second gate electrode is supplied to the capacitor electrode.

12. The display device of claim 1, wherein an identical voltage is supplied to the first gate electrode and the second gate electrode.

13. A display device, comprising:
a display panel in which a plurality of gate lines, a plurality of data lines and a plurality of subpixels are disposed;
a plurality of light-emitting elements disposed in each of the plurality of subpixels; and
a plurality of driving transistors disposed in each of the plurality of subpixels, and electrically connected to the plurality of light-emitting elements,
wherein each of the plurality of driving transistors comprises,
an active layer;
a first gate electrode positioned on one surface of the active layer, and overlapping a channel region of the active layer;
a second gate electrode positioned on another surface of the active layer, and overlapping a part of the channel region of the active layer; and
a third gate electrode positioned on the another surface of the active layer, positioned farther from the active layer than the second gate electrode, and overlapping the channel region of the active layer,
wherein a length of the third gate electrode is, at largest, identical to a length of the channel region.

14. The display device of claim 13, wherein a part of the third gate electrode overlaps the second gate electrode.

15. The display device of claim 13, wherein a part of a boundary of the third gate electrode overlaps a part of a boundary of the second gate electrode.

16. The display device of claim 13, wherein an identical voltage is supplied to the first gate electrode and the second gate electrode, and a constant voltage different from the voltage supplied to the second gate electrode is supplied to the third gate electrode.

17. A thin film transistor, comprising:
a first gate electrode;
an active layer positioned on the first gate electrode, and including a channel region overlapping at least a part of the first gate electrode;
a second gate electrode positioned on the active layer, and overlapping a first area of the channel region; and
a third gate electrode at least partially positioned on the second gate electrode, overlapping at least a part of the second gate electrode, and overlapping at least a part of a second area except the first area of the channel region,
wherein one end of the second gate electrode overlaps with a boundary of one side of the channel region, and another end of the second gate electrode is spaced apart from a boundary of another side of the channel region.

18. The thin film transistor of claim 17, wherein a vertical distance between a part of the third gate electrode and the active layer is a first distance, and a vertical distance between another part of the third gate electrode and the active layer is a second distance smaller than the first distance.

19. The thin film transistor of claim 17, wherein the active layer further includes a source region and a drain region.

* * * * *